United States Patent [19]

Takasugi

[11] Patent Number: 5,311,483
[45] Date of Patent: May 10, 1994

[54] SYNCHRONOUS TYPE SEMICONDUCTOR MEMORY

[75] Inventor: Atsushi Takasugi, Tokyo, Japan

[73] Assignee: Oki Electric Industry Co., Ltd., Tokyo, Japan

[21] Appl. No.: 890,592

[22] PCT Filed: Nov. 19, 1991

[86] PCT No.: PCT/JP91/01584
§ 371 Date: Apr. 12, 1993
§ 102(e) Date: Apr. 12, 1993

[87] PCT Pub. No.: WO92/09083
PCT Pub. Date: May 29, 1992

[30] Foreign Application Priority Data
Nov. 20, 1990 [JP] Japan ................. 2-316522

[51] Int. Cl.$^5$ ................. G11C 11/402; G11C 29/00
[52] U.S. Cl. ................. 365/233; 365/236; 365/194
[58] Field of Search ........... 365/193, 194, 233, 189.05, 365/236

[56] References Cited
U.S. PATENT DOCUMENTS
4,970,693 11/1990 Nozaki et al. ................. 365/233 X
4,985,868 1/1991 Nakano et al. ................. 365/233 X FOREIGN PATENT DOCUMENTS
0051920 5/1982 European Pat. Off. .
0280882 9/1988 European Pat. Off. .
0322901 7/1989 European Pat. Off. .
53-108243 9/1978 Japan .
56-044919 4/1981 Japan .
63-217452 9/1988 Japan .
2-105389 4/1990 Japan .

OTHER PUBLICATIONS

IBM Technical Disclosure Bulletin, vol. 30, No. 5, Oct. 1987, New York U.S., pp. 161–162, 'Self-timed performance test for stand-alone random-access memories' & Patent Abstracts of Japan, vol. 5, No. 104 (P-069), Jul. 1981.
IBM Technical Disclosure Bulletin, vol. 31, No. 8, Jan. 1989, New York U.S., pp. 47–49, 'Method providing wait-state processor cycles using medium speed dynamic RAM' p. 49, lines 5–19; FIGS. 1,2.

Primary Examiner—Joseph A. Popek
Attorney, Agent, or Firm—Spencer, Frank & Schneider

[57] ABSTRACT

A DRAM is capable of regulating an output timing of a read data. The output timing of the read data can be regulated by the DRAM which has a circuit (127) for counting the number of clock pulses until the read data is transferred to a data latch circuit (121) and a circuit (129) for outputting the counted number. The DRAM has a circuit (125) which can regulate the output timing in response to an external input signal.

11 Claims, 8 Drawing Sheets

SYNCHRONOUS TYPE SEMICONDUCTOR MEMORY

TECHNICAL FIELD

The present invention relates to a synchronous type semiconductor memory, particularly to an output control system of a synchronous type dynamic random access memory (hereinafter referred to as DRAM).

BACKGROUND TECHNOLOGY

A conventional synchronous type semiconductor memory is disclosed in Japanese Laid-Open Patent Publication No. 61-39295 and No. 62-275384.

The synchronous type semiconductor memory has a memory cell array in which memory cells are arranged in rows and columns.

A decoder is coupled to an input of the memory cell array. A latch circuit and an output buffer are coupled to an output of the memory cell array. When data is read from the memory cell array, externally generated input addresses are decoded by a decoder so that one of the memory cells is selected in the memory cell array. Data stored in the thus selected memory cell is latched temporarily in the latch circuit. The data latched being synchronized with a synchronous clock is thereafter read out via the output buffer. In a synchronous type static random access memory (hereinafter referred to as SRAM), one pulse alone of a synchronous clock is supplied to the output buffer during a memory access time so that the read data can be accurately output in synchronism with the clock pulse. access starting time to the time when the latch completion signal is generated, and a delay clock number output circuit for outputting the output of the clock counter circuit to an external device.

A second aspect of the present invention comprises a DRAM which selects a memory cell by decoding an address and performs writing data in or reading data from the memory cell, wherein the DRAM further comprises a data latch circuit for latching the data read from the memory cell, an output clock delay control circuit for generating an output control signal.,in response to the number of delay clocks which are set by a synchronous clock and an external input signal, and an output circuit for outputting the read data, which is latched by the data latch circuit, in response to the output control signal.

BEST MODE FOR CARRYING OUT THE INVENTION

A plurality of pulses of consecutive synchronous clocks are input to the output buffer during a memory access time in the DRAM. If the conventional synchronization system is applied to the DRAM, it is necessary to previously determine which pulse of the synchronous clock should be selected to output the read data via the output buffer in response thereto.

In the DRAM, since an input of the address and the reading or writing of the data are performed during a memory access time, there is a possibility of generating the lag of the time when the read data is applied to the latch circuit. Accordingly, it is impossible to accurately control the action timing of the output buffer in the DRAM which employs the conventional synchronization system.

It is an object of the present invention to provide a synchronous type DRAM which selects an optimal pulse among a plurality of pulses of the synchronous clocks during a memory access time to determine the operating timing of the output buffer.

It is another object of the present invention to provide a synchronous type DRAM which can perform the accurate synchronous control.

DISCLOSURE OF THE INVENTION

Figure 1:
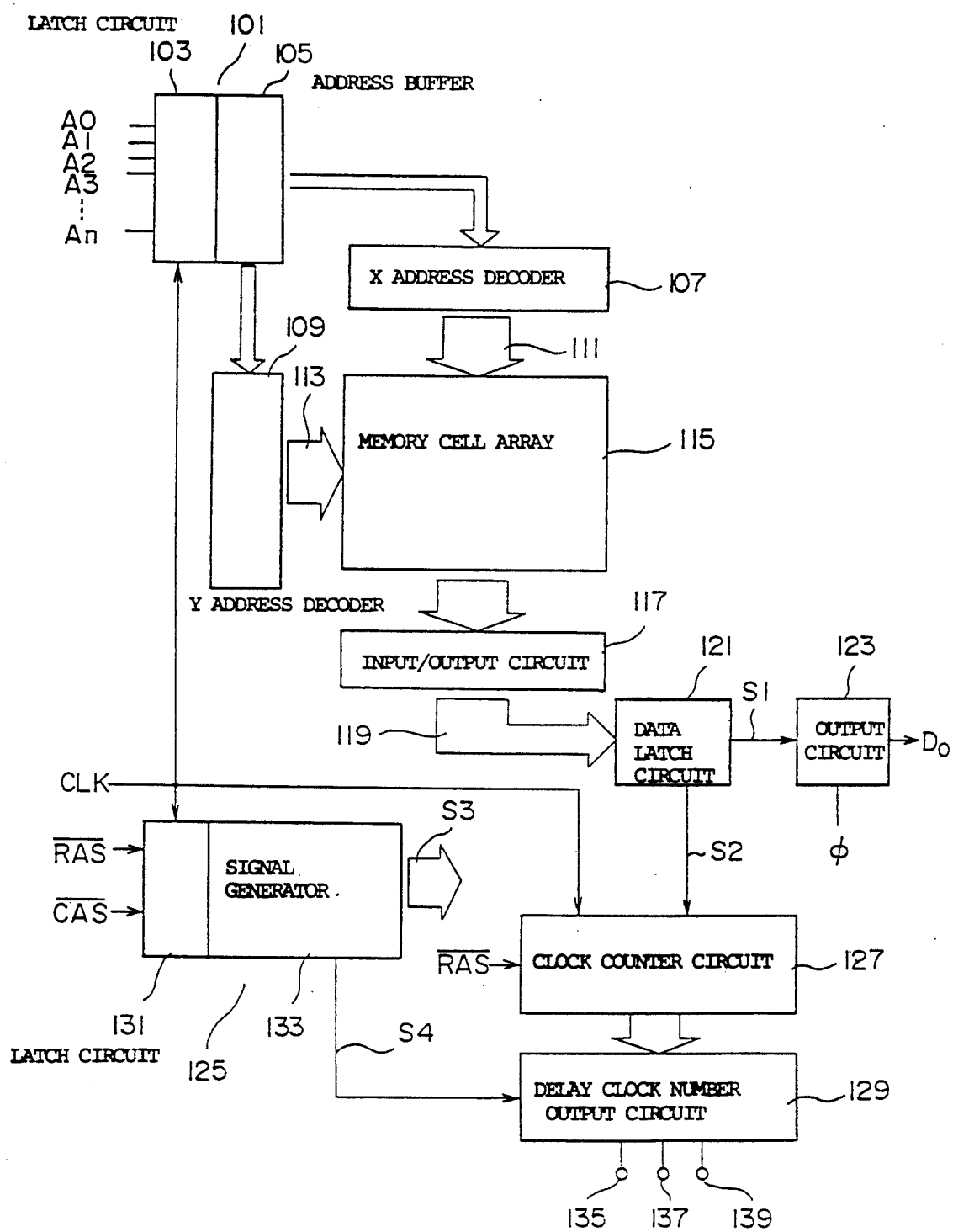
FIG. 1 is a block diagram showing an arrangement of a synchronous type DRAM according to a first embodiment of the present invention.

A first aspect of the present invention comprises a DRAM which selects a memory cell by decoding an address and writes data in or reads data from the memory cell wherein the DRAM comprises a data latch circuit for latching the read data of the memory cell and supplying a latch completion signal, an output circuit for outputting the read data which is latched by the data latch circuit, a clock counter circuit for counting the number of synchronous clocks during the period from the FIG. 1 is a block diagram showing schematic arrangement of a synchronous type DRAM according to a first embodiment of the present invention.

The synchronous DRAM includes an address input circuit 101 for receiving externally generated addresses A0 to An and generating X addresses and Y addresses. The address input circuit 101 comprises a latch circuit 103 for receiving the addresses A0 to An in synchronism with a synchronous clock (hereinafter referred to as CLK) and an address buffer 105 for generating the X addresses and the Y addresses in response to an output of the latch circuit 103. An output of the address buffer 105 is coupled to an X address decoder 107 and a Y address decoder 109.

Outputs of the respective X address decoder 107 and the Y address decoder 109 are coupled to word lines 111 and bit lines 113 which are coupled to a memory cell array 115 in which memory cells, not shown, are arranged in matrix. The memory cells are located at the intersection of the word lines 111 and the bit lines 113. The X address decoder 107 selects one word line among a plurality of word lines 111. The Y address decoder selects one bit line among a plurality of bit lines 113.

The word lines 111 are coupled to a data bus line 119 by way of an input/output circuit 117 for performing a read/write cycle. The data bus 119 is coupled to a data latch circuit 121. The data latch circuit 121 latches the data read on the data bus 119. The data latch circuit 121 supplies thereafter a latched read data S1 to an output circuit 123 and outputs a latch completion signal S2.

The output circuit 123 is enabled by an output control signal φ which is synchronized with the clock signal CLK and outputs the read data S1 as a read data DO. The output circuit 123 comprises an output buffer according to the present invention.

The DRAM has a memory control signal generator 125, a clock counter circuit 127 and a delay clock number output circuit 129. The memory control signal generator 125 receives an externally generated clock signal CLK, an externally generated low address strobe signal $\overline{RAS}$ and an externally generated column address strobe signal $\overline{CAS}$ and generates various memory control signals S3 for controlling an internal circuit in the memory and a drive signal S4. The memory control signal generator 125 comprises a latch circuit 131 which latches a low address strobe signal $\overline{RAS}$ and the column address strobe signal $\overline{CAS}$ in response to the clock signal CLK and a signal generator 133 for receiving an output of the latch circuit 131 and generating the memory control signals S3 and the drive signal S4. The drive signal S4 is supplied to the delay clock number output circuit 129.

The clock counter circuit 127 counts the number of pulses or clocks of the clock signal CLK in response to falling of the low address strobe signal $\overline{RAS}$. The clock counter circuit 127 stops the counting operation in response to the latch completion signal S2 from the data latch circuit 121. An output of the clock counter circuit 127 is coupled to the delay clock number output circuit 129. The delay clock number output circuit 129 supplies an output of the clock counter circuit 127 to delay clock number output terminals 135, 137, and 139 in response to the drive signal S4 issued by the memory control signal generator 8. The output terminal 135 generates a least significant bit of the counted number of clocks (binary digit), and the output terminal 137 generates a least significant bit and the output terminal 139 generates a most significant bit.

Figure 2:
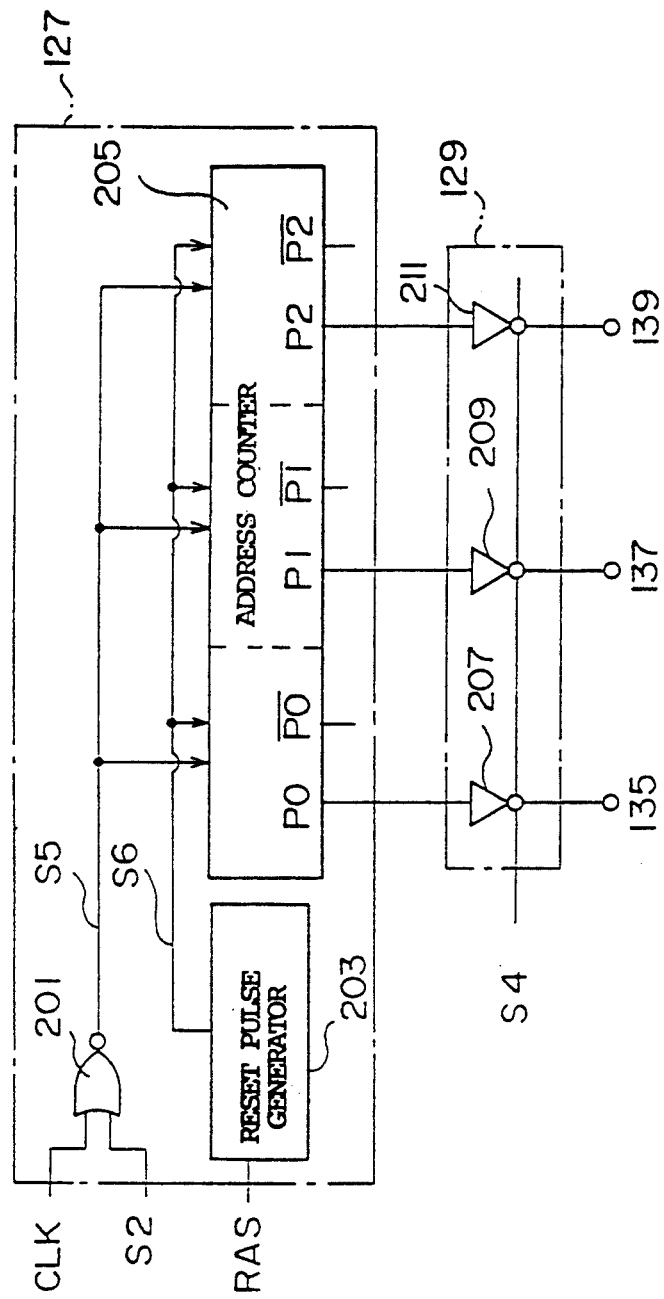
FIG. 2 is a circuit diagram showing a clock counter circuit and a delay clock number output circuit.

FIG. 2 is a circuit diagram showing the clock counter circuit 127 and the delay clock number output circuit 129 as illustrated in FIG. 1.

The clock counter circuit 127 comprises a NOR gate 201 for controlling an input of the clock signal CLK by the latch completion signal S2 and generating a drive clock signal S5 and a reset pulse generator 203 for generating a reset signal S6 in response to the low address strobe signal $\overline{RAS}$. An output of the NOR gate 201 is coupled to an address counter 205. The address counter 205 is reset in response to the reset signal S6 and counts up the addresses in response to the drive clock signal S5. Outputs P0, P1 and P2 of the address counter 205 are coupled to inputs of the delay clock number output circuit 129. The output P0 of the address counter represents the least significant bit, the output P1 represents the next significant bit and the output P2 represents the most significant bit respectively of the counted address number (binary number).

The delay clock number output circuit 129 comprises tri-state inverters 207, 209 and 211 which are respectively closably controlled by the drive signal S4 and delay clock number output terminals 135, 137, and 139 which are respectively coupled to outputs of the tri-state inverters 207, 209, and 211.

Figure 3:
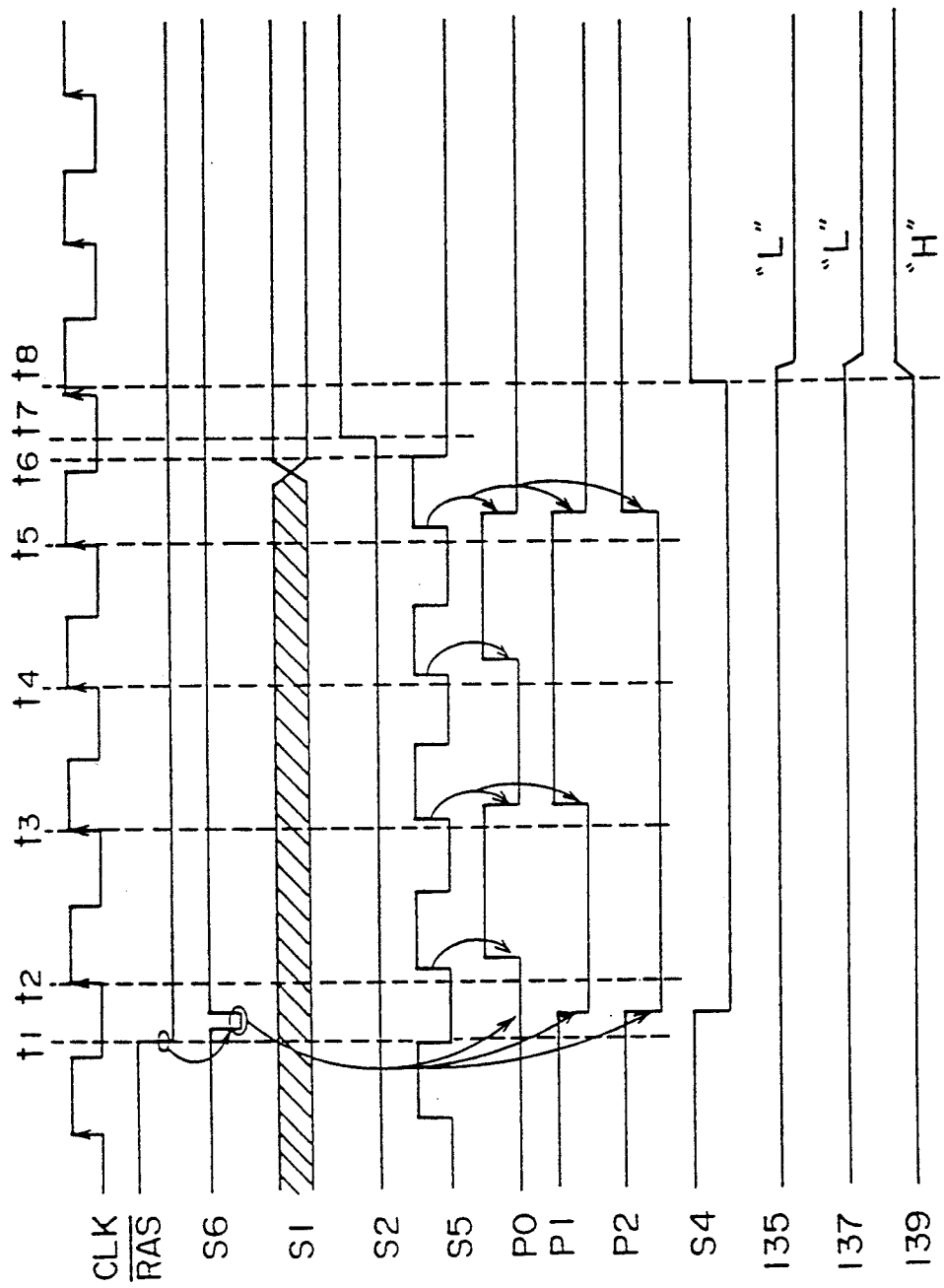
FIG. 3 is a timing chart of FIG. 1.

FIG. 3 is a timing chart of FIG. 1. The operations of the arrangements in FIGS. 1 and 2 will be described with reference to FIG. 3.

When the low address strobe signal $\overline{RAS}$ falls at the time t1 to thereby start access (reading data), a one-shot pulse of the reset signal S6 is supplied from the reset pulse generator 203 in the clock counter circuit 127. The address counter 205 is reset in response to the reset signal S6 so that the outputs P0, P1 and P2 go LOW. Since no read data is transferred from the data bus 119 to the data latch circuit 121 until the time t7, the latch completion signal S2 which has been supplied from the data latch circuit 121 is held LOW. Accordingly, the NOR gate 201 in the clock counter circuit 127 receives the clock signal CLK and supplies a drive clock signal S5 to the address counter 205 until the time t7, whereby the address counter 205 counts up the binary digits (refer to outputs P0, P1 and P2) in synchronism with the rising of the drive clock signal S5 at the times t2, t3, t4 and t5.

The externally generated addresses A0 to An are fetched to the address input circuit 101 during those times. The X address and the Y address are generated from the address input circuit 101 and are respectively supplied to the X address decoder 107 and the Y address decoder 109. The X address decoder 107 decodes the X address and the Y address decoder 109 decodes the Y address and they respectively select a memory cell in the memory cell array 115. The data stored in the selected memory cell is transferred to the data latch circuit 121 via the data bus 119 at the time t6.

At the time t7 when a certain time lapses after the time t6, the latch completion signal S2 supplied from the data latch circuit 121 goes HIGH so that the output of the clock signal CLK from the NOR gate 201 in the clock counter circuit 127 is stopped. Accordingly, the levels of the signals from the outputs P0, Pi and P2 are fixed. The drive signal S4 which is supplied from the memory control signal generator 125 goes HIGH at the time t8 so that the ti-i-state inverters 207, 209 and 211 in the delay clock number output circuit 129 are ON and the fixed levels of the signals of the outputs P0, PI and P2 of the address counter appear on the output terminals 135, 137 and 139 of the delay clock number output circuit 129 by way of the tri-state inverters 207, 209 and 211.

It is possible to easily judge which clock pulse among the plurality of consecutive pulses of the clock signal CLK, which is applied during a memory access time can generate the output of the output circuit 123 in the optimal clock synchronous operation when the output circuit 123 is enabled by measuring the output terminals 135, 137, 139, etc. of the delay clock number output circuit 129 with a tester and the like.

Generally in the DRAM, the data transferring time ranging from the access start time to the latching time by the data latch circuit 121 varies due to the manufacturing variation. The data transferring time can be judged by the numbers of delay clocks which are supplied from the output terminals 135, 137 and 139 of the delay clock number output circuit 129. The output control signal φ which is synchronous with the clock signal CLK can be generated based on the result of judgement. The output circuit 123 is activated by the output control signal φ to thereby generate the read data DO, whereby the read data DO can be accurately generated in synchronism with the clock signal CLK.

Figure 4:
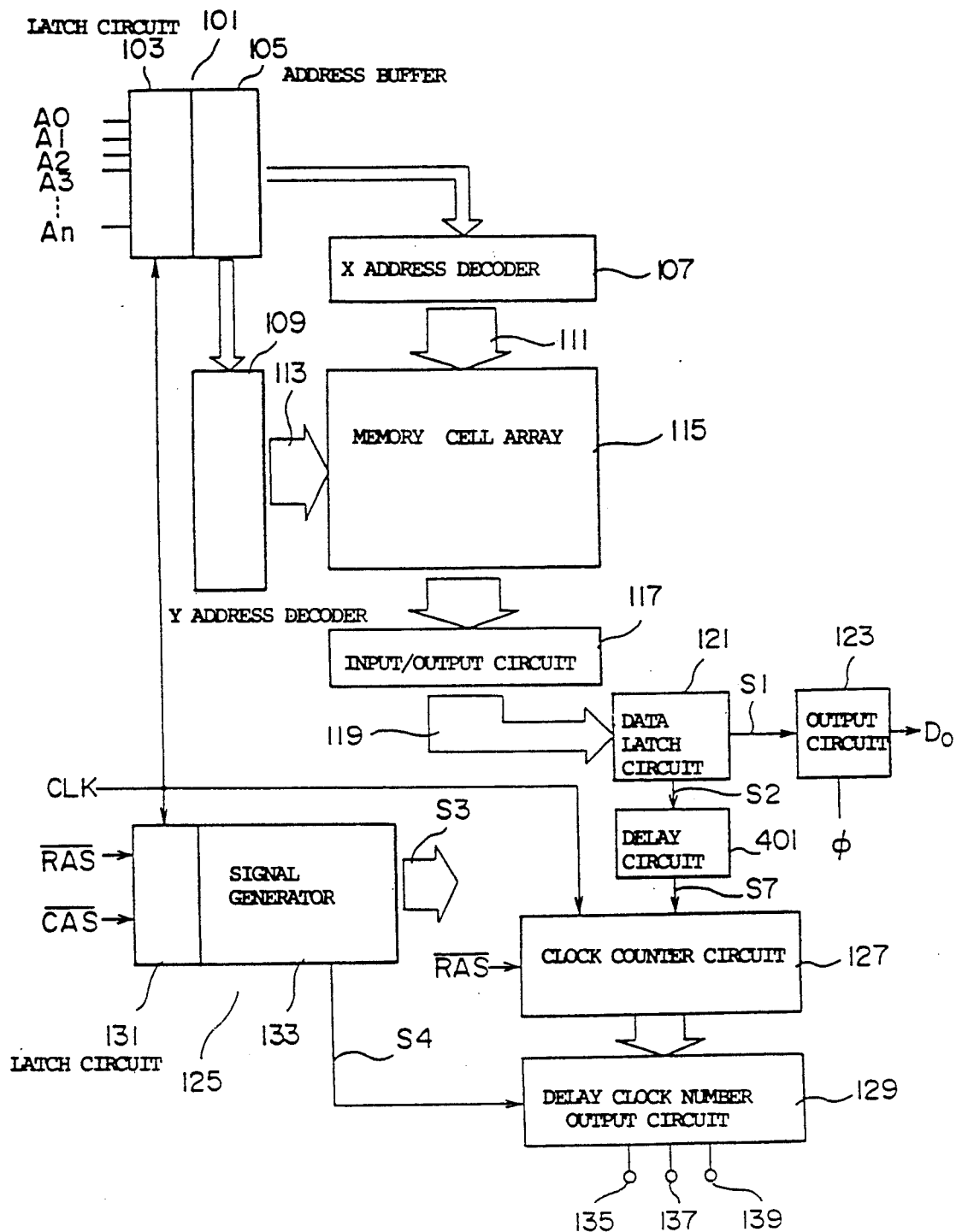
FIG. 4 is a block diagram showing an arrangement of a synchronous type DRAM according to a second embodiment of the present invention.

FIG. 4 is a block diagram showing a schematic arrangement of the synchronous type DRAM according to a second embodiment of the present invention in which the elements which are common to those in FIG. 1 are denoted with the same numerals.

The DRAM of the second embodiment is same as that of the first embodiment except that a delay circuit 401 is coupled between the output of the data latch circuit 121 and the input of the clock counter circuit 127. The delay circuit 401 receives the latch completion signal S2 supplied by the data latch circuit 121 and generates a latch completion delay signal S7 which is delayed by a given delay time Td. The delay circuit 401 supplies the latch completion delay signal S7 to the clock counter circuit 127.

The delay circuit 401 of the second embodiment comprises multiple stages of inverters.

Figure 5:
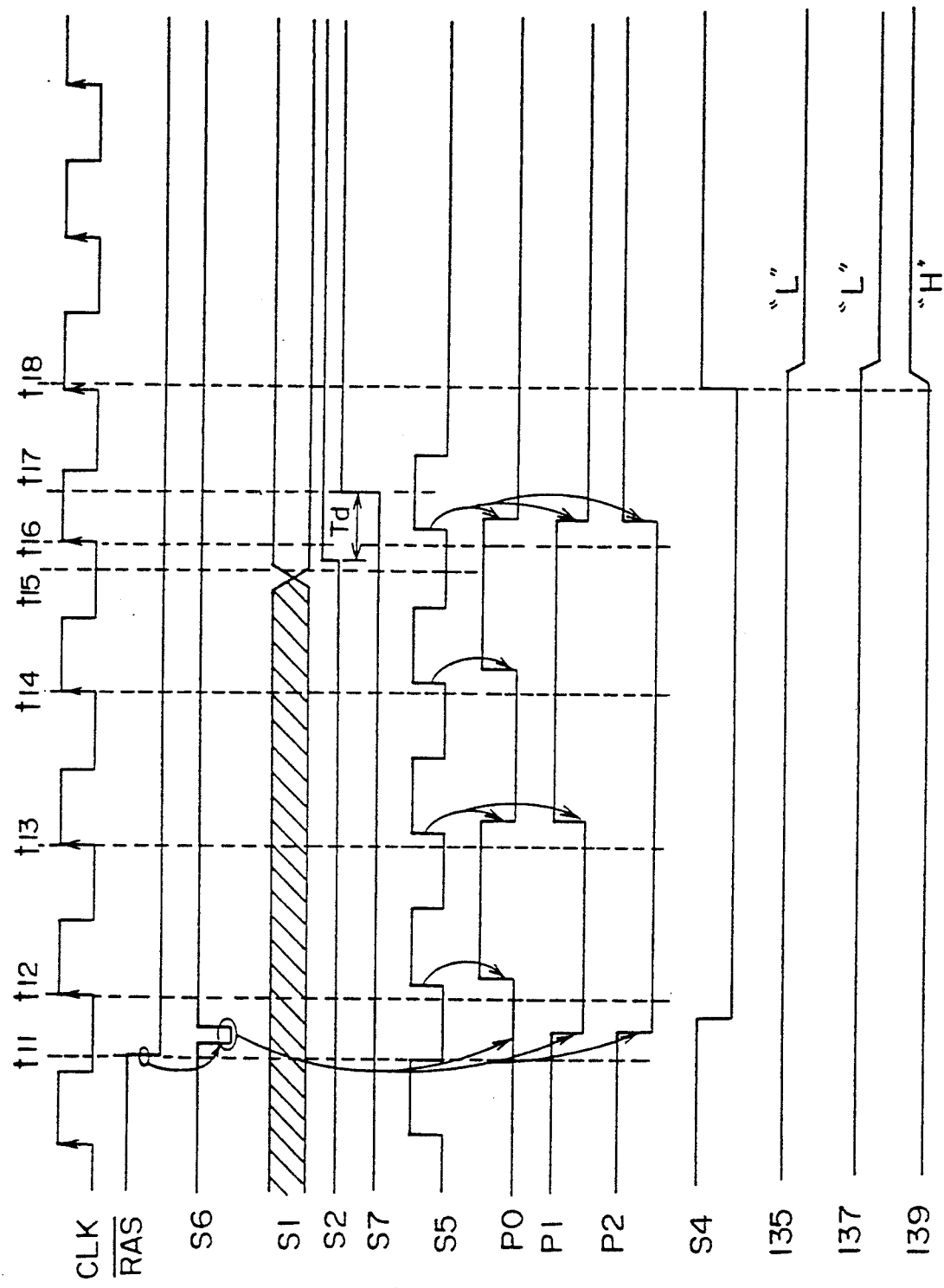
FIG. 5 is a timing chart of FIG. 4.

FIG. 5 is a timing chart of FIG. 4 with reference to which the operation of the DRAM of the second embodiment will be described hereinafter.

Since the read data is not transferred to the data latch circuit 121 during the period ranging from the time t11 when the $\overline{RAS}$ falls to start access to the time t15, the latch completion signal S2, which is supplied by the data latch circuit 121, is LOW. Accordingly, the clock counter circuit 127 is synchronous with the nosing of the drive clock signal S5 at the times t12, t13, t14 and t16 and starts to count the pulses. During the period, a memory cell is selected and the data stored in the thus selected memory cell is transferred to the data latch circuit 121 via the data bus 119 at the time t15.

When the read data is transferred to the data latch circuit 121, the latch completion signal S2 supplied by the data latch circuit 121 goes HIGH. The latch completion signal S2 is delayed for the prescribed delay time Td in the delay circuit 401 and supplied by the delay circuit 401 as the latch completion delay signal S7 which becomes HIGH at the time t17. The clock counter circuit 127 stops to count the pulses in response to the latch completion delay signal S7. Thereafter, the drive signal S4, which is supplied by the memory control signal generator 125, goes HIGH at the time t18. The levels of the signals of the outputs P0, P1 and P2 of the address counter 205 of the stopped clock counter circuit 127 appear on the output terminals 135, 137 and 139 of the delay clock number output circuit 129 in response to the drive signal S4.

Since the delay circuit 401 is provided in the output of the data latch circuit 129 according to the second embodiment, a margin can be obtained considering the variation in manufacture and the worst condition in the operation. Accordingly, since the optimal delay clock number can be selected considering the margin compared with that of the first embodiment, it is possible to generate the read data synchronizing with the clock signal CLK with high accuracy.

Figure 6:
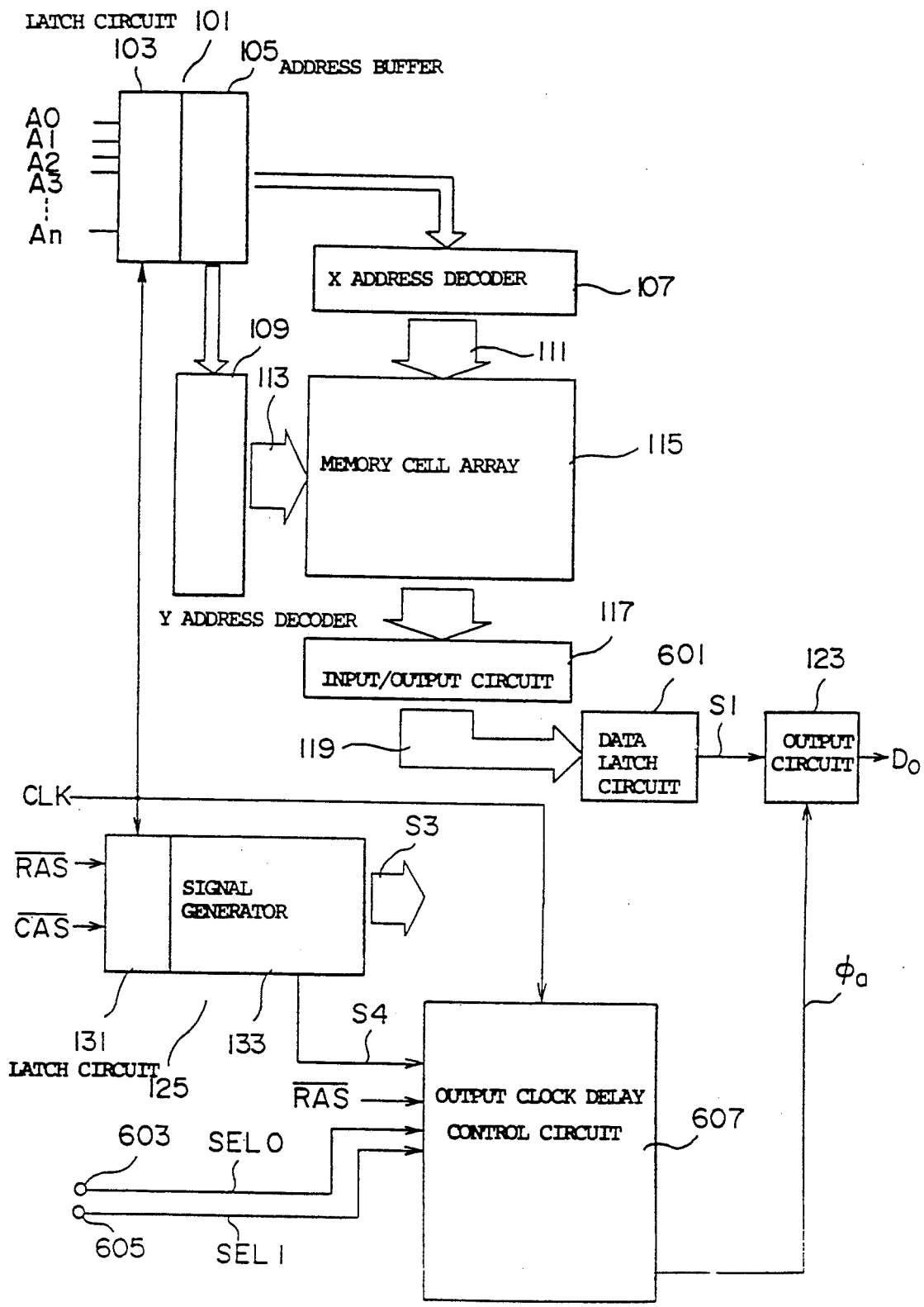
FIG. 6 is a block diagram showing an arrangement of a synchronous type DRAM according to a third embodiment of the present invention.

FIG. 6 is a block diagram showing a schematic arrangement of the synchronous type DRAM according to a third embodiment of the present invention in which the elements which are common to those in the first embodiment are denoted with the same numerals.

The DRAM of the third embodiment has a data latch circuit 601, instead of the data latch circuit 121 in the first embodiment, which latches the data read from the memory cell from the data bus 119 and supplies the thus read and latched data S1 to the output circuit 123. The DRAM of the third embodiment has external input terminals 603 and 605 and an output clock delay control circuit 607 instead of the clock counter circuit 127 and the delay clock number output circuit 129 in the first embodiment.

The external input terminals 603 and 605 receive respectively externally generated input signals SEL0 and SEL1 for designating the delay clocks and are coupled to an output clock delay control circuit 607.

The output clock delay control circuit 607 receives the clock signal CLK, the low address strobe signal $\overline{RAS}$, the drive signal S4 from the memory control signal generator 125 and the externally generated input signals SEL0 and SEL1 to thereby generate the output control signal $\phi a$ for operating the output circuit 123.

Figure 7:
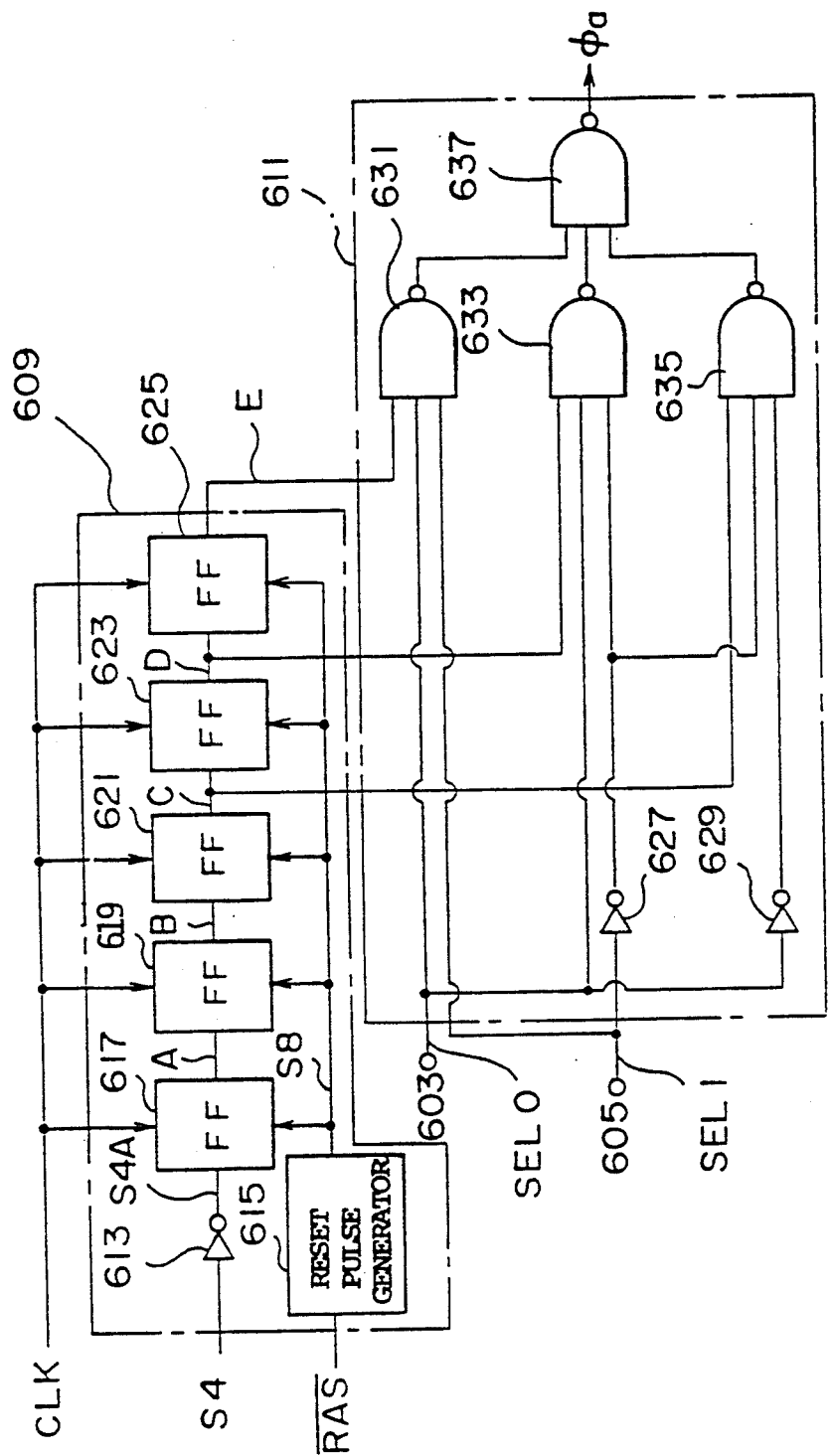
FIG. 7 is a circuit diagram of an output clock delay control circuit in FIG. 6.

FIG. 7 is a circuit diagram showing an arrangement of the output clock delay control circuit 607 as illustrated in FIG. 6.

The output clock delay control circuit 607 comprises a shift register portion 609 and a logic circuit 611. The shift register portion 609 comprises an inverter 613 for inverting the drive signal S4 which falls in synchronism with the fall of the low address strobe signal $\overline{RAS}$, a reset pulse generator 615 which generates a reset signal S8 having a one-shot pulse which is synchronous with the rise and the fall of the low address strobe signal $\overline{RAS}$, five flip-flops (hereinafter referred to as FFs) 617, 619, 621, 623 and 625 for shifting the output of the inverter 613 in synchronism with the clock signal CLK. The output of the inverter 613 is coupled to the input of the first FF 617. The output of the first FF 617 is coupled to the input of the second FF 619. The output of the second FF 619 is coupled to the input of the third FF 621. The output of the third FF 621 is coupled to the input of the fourth FF 623. The output of the fourth FF 623 is coupled to the input of the fifth FF 625. The output of the reset pulse generator 615 is coupled to reset inputs of the first to fifth FFs 617 to 625. The clock signal CLK is applied to the timing inputs of the first to fifth FFs 617 to 625. The output of the third, fourth and fifth FFs 621, 623 and 625 of the shift register portion 609 are respectively supplied to the logic circuit 611.

The logic circuit portion 611 is the circuit to select the timing of the fall of the output control signal $\phi a$ based on the combination of the output of the shift register portion 609 and the external input signals SEL0 and SEL1. The logic circuit portion 611 comprises first and second input terminals 603 and 605 for receiving the externally generated input signals SEL0 and SEL1, inverters 627 and 629, first, second and third NAND gates 631, 633 and 635 for receiving and selecting signals, and a fourth NAND gate 637 for generating the output control signal $\phi$ in response to the outputs of the NAND gates 631, 633 and 635. The first external terminal 603 is coupled to first inputs of the first and second NAND gates 631 and 633 and is also coupled to a first input of the third NAND gate 635 by way of the inverter 629. The second external terminal 605 is coupled to a second input of the first NAND gate 631 and also coupled to second inputs of the second and third NAND gates 633 and 635 by way of the inverter 627. The output of the third FF 621 is coupled to a third input of the third NAND gate 635. The output of the fourth FF 623 is coupled to a third input of the second NAND gate 633. The output of the fifth FF 625 is coupled to a third input of the first NAND gate 631. The outputs of the first to third NAND gates 631, 633 and 635 are coupled to the first to third inputs of the fourth NAND gate 637.

Figure 8:
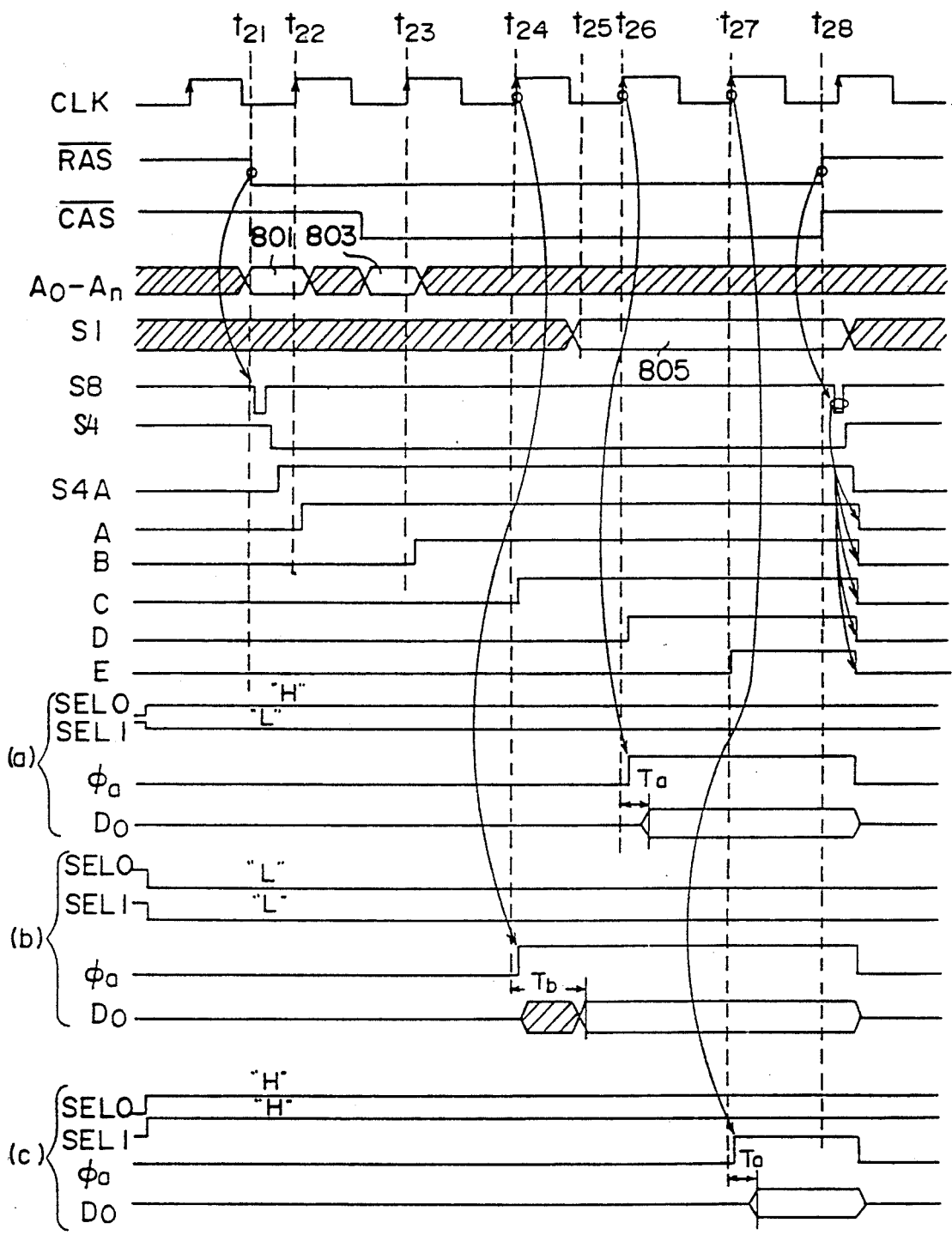
FIG. 8 is a timing chart of FIG. 6.

FIG. 8 is a timing chart showing the operation of the synchronous type DRAM in FIG. 6.

The address input circuit 101 receives an X address 801 among addresses A0 to An at the time close to the time t22 and also receives a Y address 803 at the time close to the time t23. Another X address and another Y address, which are respectively supplied as analog data from the address buffer 105 independently of the clock signal CLK, are transferred to the X address decoder 107 and the Y address decoder 109. A memory cell in the memory cell array 115 is selected in response to the outputs of the X address decoder 107 and the Y address decoder 109. Data 805 stored in the selected memory cell is transferred to the data latch circuit 601 via the data bus 119 at the time t25.

The low address strobe signal $\overline{RAS}$, which is applied to the shift register portion 609 of the output clock control circuit 607, falls at the time t21 and the reset pulse generator 615 generates the reset signal S8 having one shot pulse in response to the fall of the low address strobe signal $\overline{RAS}$. The first to fifth FFs 617 to 625 are reset slightly behind the time t21 in response to the reset signal S8 (since all the outputs of the first to fifth FFs in FIG. 8 are LOW, reset operations do not appear on the signals). The drive signal S4 falls thereafter and the output signal S4A of the inverter 613 rises to go HIGH in response to the fall of the drive signal S4. At the time t22 when the output signal S4A goes HIGH and the first clock signal CLK rises, the output signal A of the first FF 617 goes HIGH from LOW. Successively, the output signals B to E of the second to fifth FFs 619 to 625 go HIGH from LOW at the times t23 to t27. Thereafter, the low address strobe signal $\overline{RAS}$ rises at the time t28 and the reset pulse generator circuit generates the reset signal S8 having one shot pulse in response to the rise of the low address strobe signal $\overline{RAS}$ and at the same time the drive signal S4 also rises. Accordingly, the output signal A of the inverter 613 goes LOW from HIGH. The output signals A to E of the first to fifth FFs 617 to 625 go LOW from HIGH in response to the pulse of the reset signal S8.

The operation of the logic circuit portion 611 of the output clock delay control circuit 607 will be described hereinafter. The operation will be described in three cases. The first case is that the external input signal SEL0 is HIGH and the external input signal SELL is LOW (refer to FIG. 8(a)). The second case is that the external input signals SEL0 and SEL1 are respectively LOW (refer to FIG. 8(b)). The third case is the external input signals SEL0 and SEL1 are respectively HIGH (refer to FIG. 8(c)).

In the First Case

The output control signal $\phi$ which is the output signal of the fourth NAND gate 637 rises at the time t26 and falls at the time t28. This is explained in the Table 1 set forth hereunder in which the inputs and outputs of the first to fourth NAND gates and other signals are represented by HIGH and LOW levels.

TABLE 1

| Signals | level at time t26 | level at time t28 |
|---|---|---|
| SEL0 | H | H |
| SEL1 | L | L |
| C | H | H → L |
| D | L → H | H → L |
| E | L | H → L |
| input of the first NAND 631 | L, H, L | H → L, H, L |
| output of the first NAND 631 | H | H |
| input of the second NAND 633 | L → H, H, H | H → L, H, H |
| output of the second NAND 633 | H → L | L → H |
| input of the third NAND 635 | H, H, L | H → L, H, L |
| output of the third NAND 635 | H | H |
| input of the fourth NAND 637 | H, H → L, H | H, L → H, H |

TABLE 1-continued

| Signals | level at time t26 | level at time t28 |
|---|---|---|
| the fourth NAND 637 (outputs of the first to third NANDS 631 to 635) | | |
| output of the fourth NAND 637 ($\phi$a) | L → H | H → L |

The output circuit 123 generates the read data D0 (805) at a time delayed by a prescribed time Ta behind the time t26 in response to the output control signal $\phi$a.

In the Second Case

The output control signal $\phi$a rises at the time t24 and falls at the time t28 which is described in the Table 2.

TABLE 2

| Signals | level at time t24 | level at time t28 |
|---|---|---|
| SEL0 | L | L |
| SEL1 | L | L |
| C | L → H | H → L |
| D | L | H → L |
| E | L | H → L |
| input of the first NAND 631 | L, L, L | H → L, L, L |
| output of the first NAND 631 | H | H |
| input of the second NAND 633 | L, L, H | H → L, L, H |
| output of the second NAND 633 | H | H |
| input of the third NAND 635 | L → H, H, H | H → L, H, H |
| output of the third NAND 635 | H → L | L → H |
| input of the fourth NAND 637 | H, H, H → L | H, H, L → H |
| output of the fourth NAND 637 ($\phi$a) | L → H | H → L |

The output circuit 123 tends to generate the read data D0 (805) in response to the output control signal $\phi$a but it generates the read data D0 after a delay time Tb which is longer than the prescribed delay time Ta at the time T24.

In the Third Case

The output control signal $\phi$a rises at the time t27 and falls at the time t28 which is explained in the Table 3.

TABLE 3

| Signals | level at time t27 | level at time t28 |
|---|---|---|
| SEL0 | H | H |
| SEL1 | H | H |
| C | H | H → L |
| D | H | H → L |
| E | L → H | H → L |
| input of the first NAND 631 | L → H, H, H | H → L, H, H |
| output of the first NAND 631 | H → L | L → H |
| input of the second NAND 633 | H, H, L | H → L, H, L |
| output of the second NAND 633 | H | H |
| input of the third NAND 635 | H, L, L | H, L, L |
| output of the third NAND 635 | H | H |
| input of the fourth NAND 637 | H → L, H, H | L → H, H, H |
| output of the fourth NAND 637 ($\phi$a) | L → H | H → L |

The output circuit 123 generates the read data D0 (805) at the time delayed by the prescribed delay time Ta behind the time t27 in response to the output control signal φa.

In the second case as illustrated in FIG. 8(b), since the read data D0 has not been supplied to the data latch circuit 601 at the rise time of the output control signal φa, it takes the time Tb ranging from the time t26 when the clock signal CLK rises to the time when the output circuit 123 generates the data. Whereupon, in the first and third cases as illustrated in FIGS. 8(a) and 8(c), since the read data D0 has been latched in the data latch circuit 601 when the output control signal φa rises, the output circuit 123 can generate the read data D0 at the time delayed by the delay time Ta behind the rise time t26 or t27.

When the first to third cases are compared with one another, the time ranging from the fall time of the low address strobe signal $\overline{RAS}$ to the access start time is short but the time from the rise time of the clock signal CLK to the access start time is long in the second case as illustrated in FIG. 8(b). The time ranging from the rise time t21 of the low address strobe signal $\overline{RAS}$ to the access start time is long in the third case as illustrated in FIG. 8(c). Accordingly, optimal output control signal φa is generated in the first case as illustrated in FIG. 8(a). Consequently, the read data D0 is generated from the output circuit 123 in response to the output control signal φa which is supplied by the output clock delay control circuit 607 when the external input signal SEL0 is set HIGH and the external input signal SEL1 is set LOW so that the optimum synchronous operation can be attained.

In case the speed of the read data which is transferred from the memory cell array 115 to the data latch circuit 601 is fast, due to the manufacturing variation of the DRAM having the same arrangement of the third embodiment, there is a possibility that the optimal synchronizing operation can be attained in the second case as illustrated in FIG. 8(b).

Since the output control signal φa can be arbitrarily set in response to the external input signals SEL0 and SEL1 and the output clock delay control circuit 607, the optimal synchronous operation can be attained according to the third case even if there are manufacturing variation and the difference in the usage thereof.

The present invention is not limited to the embodiments set forth above but can be modified variously. An example of the modification will be described hereinafter.

The clock counter circuit 127 generates the output when the clock signal CLK rises at the time t8 immediately after the read data is transferred to the data latch circuit 121 as illustrated in FIG. 3. However, the clock counter circuit 127 can generate the output when the clock signal CLK falls at the time t8. The clock counter circuit 127 generates the output when the clock signal CLK rises at the time t18 which is immediately after the generation of the latch completion delay signal S7 as illustrated in FIG. 5. However, it is also possible that the clock counter circuit 127 generates the output when the clock signal CLK falls at the time 18.

INDUSTRIAL UTILIZATION

As described above, the DRAM according to the present invention can be applied to the synchronous type DRAM which can output the read data from the memory in synchronism with the optimal clock pulse.

I claim:

1. A synchronous type semiconductor memory comprising:
   a memory cell array having a plurality of memory cells arranged in matrix;
   a selecting circuit coupled to the memory cell array for selecting a predetermined memory cell among the memory cells of said memory cell array;
   a transfer circuit coupled to said memory cell array for transferring data stored in the selected memory cell;
   a data latch circuit coupled to said transfer circuit for receiving data from said transfer circuit and latching the received data therein, said data latch circuit generating a data transfer completion signal;
   an output circuit coupled to the data latch circuit for receiving the latched data in said data latch circuit and outputting the received data in response to a control signal;
   a clock counter circuit coupled to said data latch circuit for receiving a clock signal, and data transfer completion signal, and an address strobe signal and counting number of clock pulses of the clock signal between the reception of the address strobe signal and the reception of the data transfer completion signal; and
   a delay clock number output circuit coupled to said clock counter circuit for generating a signal representing the number of pulses counted by said clock counter circuit.

2. A synchronous type semiconductor memory according to claim 1 further comprising a delay circuit coupled between said data latch circuit and said clock counter circuit for delaying the data transfer completion signal, which is supplied from said data latch circuit, and supplying the delayed data transfer completion signal to said clock counter circuit.

3. A synchronous type semiconductor memory according to claim 1, wherein the selecting circuit comprises:
   an address input circuit for receiving an address signal and generating an X address signal and a Y address signal from the address signal;
   an X address decoder coupled to the address input circuit for receiving the X address signal and selecting a row of the memory cell array in response to the X address signal; and
   a Y address decoder coupled to the address input circuit for receiving the Y address signal and selecting a column of the memory cell array in response to the Y address signal.

4. A synchronous type semiconductor memory according to claim 3, wherein the address input circuit comprises:
   a latch circuit for receiving the address signal in response to a clock signal; and
   an address buffer coupled to the latch circuit for generating the X address signal and the Y address signal in response to the address signal supplied from the latch circuit.

5. A synchronous type semiconductor memory according to claim 1 further comprising a control signal generator coupled to the delay clock number output circuit for generating a drive signal which drives the delay clock number output circuit.

6. A synchronous type semiconductor memory according to claim 1, wherein the clock counter circuit comprises:

a gate circuit for receiving the clock signal and the data transfer completion signal and controlling the output of the clock signal in response to the data transfer completion signal;

a reset signal generator for generating a reset signal; and an address counter coupled to the reset signal generator and the gate circuit for counting the number of pulses of the clock signal output from the gate circuit, the address counter reset by the reset signal.

7. A synchronous type semiconductor memory according to claim 1, wherein the delay clock number output circuit includes a tri-state inverter for receiving the output of the clock counter circuit and being closably controlled by the drive signal.

8. A synchronous type semiconductor memory comprising:

a memory cell array having a plurality of memory cells arranged in matrix;

a selecting circuit coupled to said memory cell array for selecting a predetermined memory cell among the memory cells of said memory cell array;

a transfer circuit coupled to the memory cell array for transferring data stored in the selected memory cell;

a data output circuit coupled to said transfer circuit for receiving the data from the transfer circuit and outputting the thus received data in response to a control signal;

a control signal generator for generating a drive signal in response to a clock signal and an address strobe signal; and a control circuit, coupled to the control signal generator and an external input terminal, for generating the control signal in response to an external input signal received by way of the external input terminal, the clock signal and the drive signal, sad control circuit including:

a delay signal generator coupled to the drive signal generator for generating a plurality of delay signals each of which has a different delay time in response to the clock signal and the drive signal, and a selector coupled to the delay signal generator and the external input terminal for generating the control signal that is one of the delay signals selected by the external input signal.

9. A synchronous type semiconductor memory according to claim 8, wherein the control signal generator comprises a shift register portion and a logic circuit portion.

10. A synchronous type semiconductor memory according to claim 8, wherein the delay signal generator includes a plurality of flip-flops for delaying the drive signal in response to the clock signal.

11. A synchronous type semiconductor memory according to claim 8, wherein the selector circuit includes a plurality of gate circuits.

* * * * *